US011522171B2

(12) United States Patent
Soppe

(10) Patent No.: US 11,522,171 B2
(45) Date of Patent: Dec. 6, 2022

(54) RECHARGEABLE BATTERY AND METHOD FOR MANUFACTURING THE SAME

(71) Applicant: STICHTING ENERGIEONDERZOEK CENTRUM NEDERLAND, Petten (NL)

(72) Inventor: Wilhelmus Jozef Soppe, Petten (NL)

(73) Assignee: NEDERLANDSE ORGANISATIE VOOR TOEGEPAST-NATUURWETEN SCHAPPELIJ ONDERZOEK TNO, 's-Gravenhage (NL)

(*) Notice: Subject to any disclaimer, the term of this patent is extended or adjusted under 35 U.S.C. 154(b) by 79 days.

(21) Appl. No.: 15/564,516

(22) PCT Filed: Apr. 7, 2016

(86) PCT No.: PCT/NL2016/050239
§ 371 (c)(1),
(2) Date: Oct. 5, 2017

(87) PCT Pub. No.: WO2016/163878
PCT Pub. Date: Oct. 13, 2016

(65) Prior Publication Data
US 2018/0083264 A1 Mar. 22, 2018

(30) Foreign Application Priority Data
Apr. 7, 2015 (NL) ........................ 2014588

(51) Int. Cl.
*H01M 4/04* (2006.01)
*H01M 4/38* (2006.01)
(Continued)

(52) U.S. Cl.
CPC ............ *H01M 4/134* (2013.01); *C23C 16/24* (2013.01); *C23C 16/511* (2013.01);
(Continued)

(58) Field of Classification Search
CPC .... H01M 4/134; H01M 4/364; H01M 4/1395; H01M 4/0428; H01M 10/0562;
(Continued)

(56) References Cited

U.S. PATENT DOCUMENTS 5,568,606 A * 10/1996 Dobbek ............ G11B 20/1883
360/49
8,845,764 B2 * 9/2014 Kuriki .................. H01G 9/025
29/623.5
(Continued)

FOREIGN PATENT DOCUMENTS

| CN | 102842662 | * | 9/2012 |
| EP | 2 372 751 A1 | | 10/2011 |
| WO | 2011/094642 A1 | | 8/2011 |

OTHER PUBLICATIONS

Chan et al., High-performance lithium battery anodes using silicon nanowires, Dec. 16, 2007, Nature nanotechnology, vol. 3, pp. 31-35 (Year: 2007).*

(Continued)

*Primary Examiner* — Christian Roldan
(74) *Attorney, Agent, or Firm* — Nixon & Vanderhye

(57) ABSTRACT

A rechargeable battery includes at least an electrolyte layer, a cathode layer and an anode layer. The electrolyte layer includes a lithium salt compound arranged between a cathode surface of the cathode layer and an anode surface of the anode layer. The anode layer is a nanostructured silicon containing thin film layer including a plurality of columns, wherein the columns are directed in a first direction perpendicular or substantially perpendicular to the anode surface of the silicon thin film layer. The columns are arranged adjacent to each other while separated by grain-like column boundaries running along the first direction. The columns include silicon and have an amorphous structure in which nano-crystalline regions exist.

7 Claims, 2 Drawing Sheets

Figure 1:
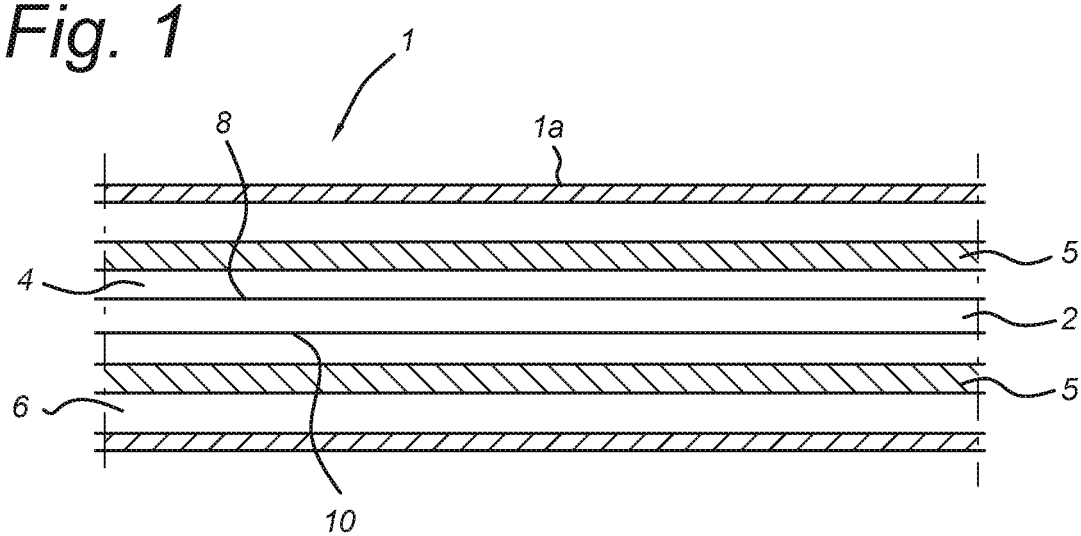

(51) Int. Cl.
*H01M 4/66* (2006.01)
*H01M 4/02* (2006.01)
*H01M 4/134* (2010.01)
*H01M 10/0525* (2010.01)
*C23C 16/24* (2006.01)
*H01M 4/1395* (2010.01)
*C23C 16/511* (2006.01)
*H01M 4/36* (2006.01)
*H01M 10/0562* (2010.01)
*B82Y 30/00* (2011.01)

(52) U.S. Cl.
CPC ....... *H01M 4/0423* (2013.01); *H01M 4/0428* (2013.01); *H01M 4/1395* (2013.01); *H01M 4/364* (2013.01); *H01M 4/386* (2013.01); *H01M 4/661* (2013.01); *H01M 10/0525* (2013.01); *H01M 10/0562* (2013.01); *B82Y 30/00* (2013.01); *H01M 2004/021* (2013.01); *H01M 2300/0068* (2013.01)

(58) Field of Classification Search
CPC ............. H01M 4/661; H01M 4/0423; H01M 10/0525; H01M 4/386; H01M 2300/0068; H01M 2004/021; C23C 16/511; C23C 16/24; B82Y 30/00
USPC ........................................................ 429/322
See application file for complete search history.

(56) References Cited

U.S. PATENT DOCUMENTS

| | | | |
|---|---|---|---|
| 2001/0042502 A1* | 11/2001 | Shih | H01L 29/127 117/3 |
| 2006/0024442 A1* | 2/2006 | Ovshinsky | C23C 16/24 427/255.5 |
| 2008/0152938 A1* | 6/2008 | Kelman | B22F 1/0022 428/546 |
| 2009/0104789 A1* | 4/2009 | Mallick | H01L 21/0234 438/788 |
| 2009/0169725 A1 | 7/2009 | Zhamu et al. | |
| 2011/0042642 A1* | 2/2011 | Alet | B82Y 10/00 257/9 |
| 2015/0004485 A1 | 1/2015 | Chen et al. | |
| 2017/0279154 A1* | 9/2017 | Young | H01M 4/1397 |

OTHER PUBLICATIONS

Epitaxy, Encyclopedia of Materials: Science and Technology, Elsevier Science Ltd., 2001, ISBN: 0-08-0431526, pp. 2791-2799 (Year: 2001).*

Li-Feng Cui et al: "Crystalline-Amorphous Core-Shell Silicon Nanowires for High Capacity and High Current Battery Electrodes", Nano Letters, American Chemical Society, US, vol. 9, No. 1, Jan. 1, 2009 (Jan. 1, 2009), pp. 491-495, XP007913274, ISSN: 1530-6984, [retrieved on Dec. 23, 2008], DOI: 10.1021/NL8036323.

International Search Report, dated Sep. 8, 2016, from corresponding PCT/NL2016/050239 application.

Matthew M. Braun, et al., Effective optical properties of non-absorbing nanoporous thin films, Thin Solid Films, 2006, pp. 505-514, vol. 496, Elsevier B.V.

Ning Ding, et al., Improvement of cyclability of Si as anode for Li-ion batteries, Journal of Power Sources, 2009, pp. 644-651, vol. 192, Elsevier B.V.

Uday Kasavajjula, et al., Nano- and bulk-silicon-based insertion anodes for lithium-ion secondary cells, Journal of Power Sources, 2007, pp. 1003-1039, vol. 163, Elsevier B.V.

Schmidt et al., "Growth, Thermodynamics, and Electrical Properties of Silicon Nanowires," Chemical Reviews, 2010, vol. 110, No. 1, pp. 361-388.

* cited by examiner

RECHARGEABLE BATTERY AND METHOD FOR MANUFACTURING THE SAME

FIELD OF THE INVENTION

The present invention relates to a rechargeable battery, in particular a lithium-ion rechargeable battery provided with silicon-based anode material. In a further aspect the present invention relates to a method of manufacturing a rechargeable battery.

PRIOR ART

Current state of the art lithium-ion batteries typically employ graphite as anode material, wherein storage capacity of graphite is around 370 mAh/g. It is known that silicon anode material has a much larger theoretical capacity of around 4200 mAh/g, but the intercalation process of lithium leads to a volume increase of the silicon anode material as high as 300% or even more. One of the main problems with bulk silicon anode material is that it pulverizes quickly during the intercalation process and that it loses its functionality after a relatively small number of charging cycles.

In order to deal with the volume expansion of silicon anode material and to reduce cracking and pulverization thereof during charging cycles, several silicon anode solutions have been proposed, such as silicon nanowires, nanotubes, porous silicon or to mix silicon with graphite, see for example Ning Ding, Journal of Power Sources 192 (2009) 644-651, "Improvement of cyclability of Si as anode for Li-ion batteries" and Uday Kasavajjula, Journal of Power Sources 163(2007) 1003-1039, "Nano- and bulk-silicon-based insertion anodes".

Many of the proposed solutions to manufacture silicon anode material are unattractive as various complex manufacturing steps are required, making the manufacturing process rather expensive. Also, many of the proposed solutions are not readily scalable to high yield industrial production levels for commercialization.

SUMMARY OF THE INVENTION

The present invention seeks to provide an rechargeable battery, in particular a lithium ion battery comprising silicon anode material having an improved storage capacity per unit weight and reduced capacity fading.

According to the present invention, a rechargeable battery of the type defined in the preamble is provided comprising at least an electrolyte layer, a cathode layer and an anode layer. The electrolyte layer comprises a lithium salt compound and is arranged between a cathode surface of the cathode layer and an anode surface of the anode layer. The anode layer is a continuous nanostructured thin film layer comprising a plurality of adjacent columns, the columns extending in a perpendicular direction from the anode surface. The plurality of columns are arranged "continuous", i.e., adjacent to each other while separated by interfaces extending in the perpendicular direction. The plurality of columns comprise silicon and have an amorphous structure.

The advantage of the rechargeable battery according to the present invention is that lithium ion (de)intercalation in or out of the anode layer, i.e. the nanostructured thin film layer, is greatly facilitated by the plurality of columns and the interfaces between them. The plurality of columns and interfaces provide improved lithium ion accessibility in and out of the amorphous structure of the columns that comprise silicon in the anode layer during lithium ion insertion and extraction, so that the storage capacity per unit weight of the anode layer is significantly increased and capacity fading over multiple recharging cycles is reduced.

According to the embodiment, the anode layer thus consists of an amorphous columnar material as defined above, in which nano-crystalline regions exist.

The anode layer comprises a silicon-based material.

According to an aspect of the invention, the material of the columns comprises amorphous silicon.

According to an aspect of the invention, the amorphous structure comprises up to about 80% of a nano-crystalline structure.

According to an aspect of the invention, the material of the columns comprises a silicon alloy or silicon based mixture. According to an embodiment, the silicon alloy or silicon based mixture has an amorphous structure.

The silicon alloy may be either an addition or an alternative to the amorphous silicon. Thus, according to an aspect of the invention, the material of the columns comprises at least one material selected from amorphous silicon and amorphous silicon alloy.

According to a further aspect, the material of the columns comprises amorphous silicon and nano-crystalline silicon alloy.

In some embodiments, the silicon alloy may be present in the anode layer as a nano-crystalline phase.

According to an embodiment, the silicon alloy or silicon based mixture is selected from a group of alloys or mixtures comprising Si—C, Si—N, Si—Ge, Si—Ag, Si—Sn.

In a further aspect, the present invention relates to a method for manufacturing a rechargeable battery comprising at least an electrolyte layer, a cathode layer and an anode layer. The method comprises the steps of forming on a metallic substrate a nanostructured thin film layer comprising silicon as an anode layer, wherein the forming process comprises deposition of the anode layer by low pressure PECVD and the PECVD process comprises the use of a microwave plasma of a mixture comprising a silicon containing gas and hydrogen, $H_2$, in which the forming process is configured to create the nanostructured thin film layer comprising a plurality of adjacent columns, the columns extending in a perpendicular direction from the substrate and arranged adjacent to each other while separated by column boundaries extending in the perpendicular direction, wherein the plurality of columns comprise silicon and have an amorphous structure in which nano-crystalline regions exist.

The method further comprises providing a lithium salt compound as the electrolyte layer and arranging the electrolyte layer between a cathode surface of the cathode layer and an anode surface of the anode layer.

The advantage of the method of the present invention is that the forming process is a self-organizing and spontaneous process for forming on a substrate a continuous amorphous layer nanostructured with a plurality of columns and interfaces there between, yielding a rechargeable battery having an increased storage capacity per unit weight and a reduced capacity fading.

According to the method, the interfaces in the nanostructured amorphous anode layer will locally be perpendicular to the surface with the electrolyte layer.

In some embodiments the method stimulates dendritic or multibranch growth of silicon columns, wherein the grain-like or crystal-like engagement between adjoining silicon columns is maintained.

The method of the present invention is essentially a single step manufacturing process without the need for pre- or post-treatment method steps for e.g. the substrate and/or the silicon anode layer, thereby facilitating industrial production levels for commercialization.

SHORT DESCRIPTION OF DRAWINGS

Figure 2:
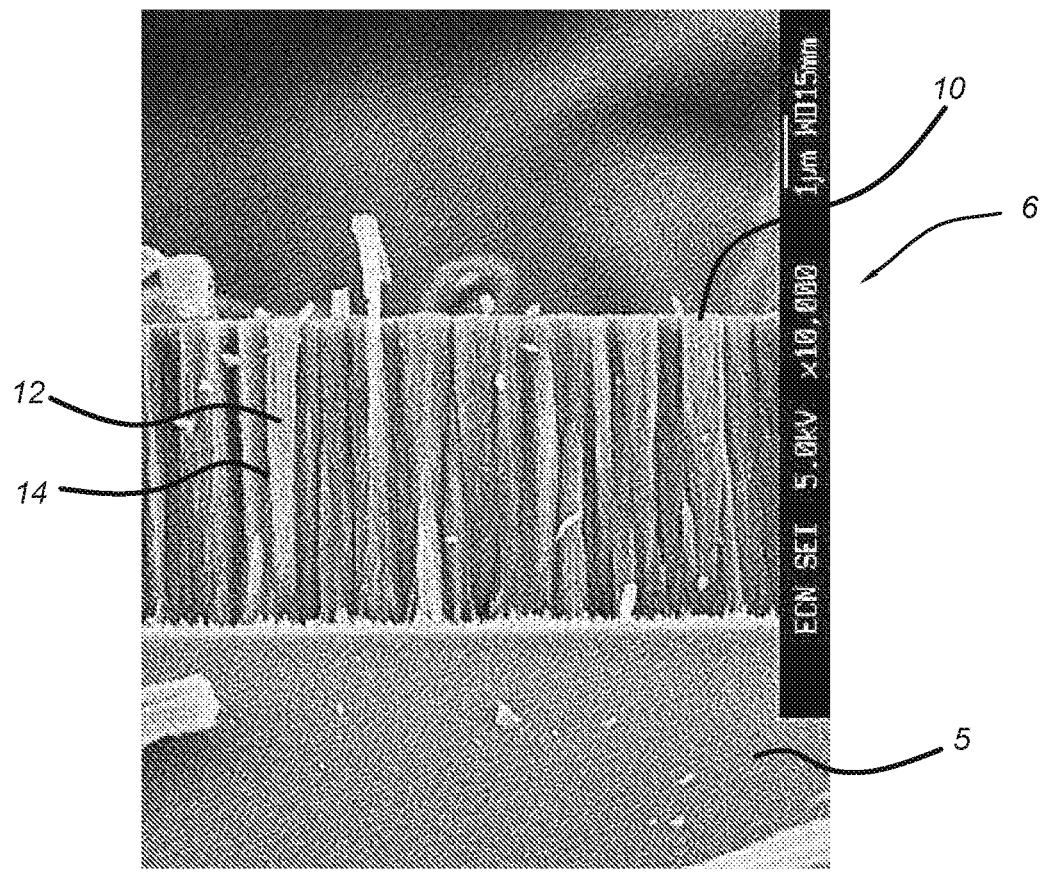
Figure 3:
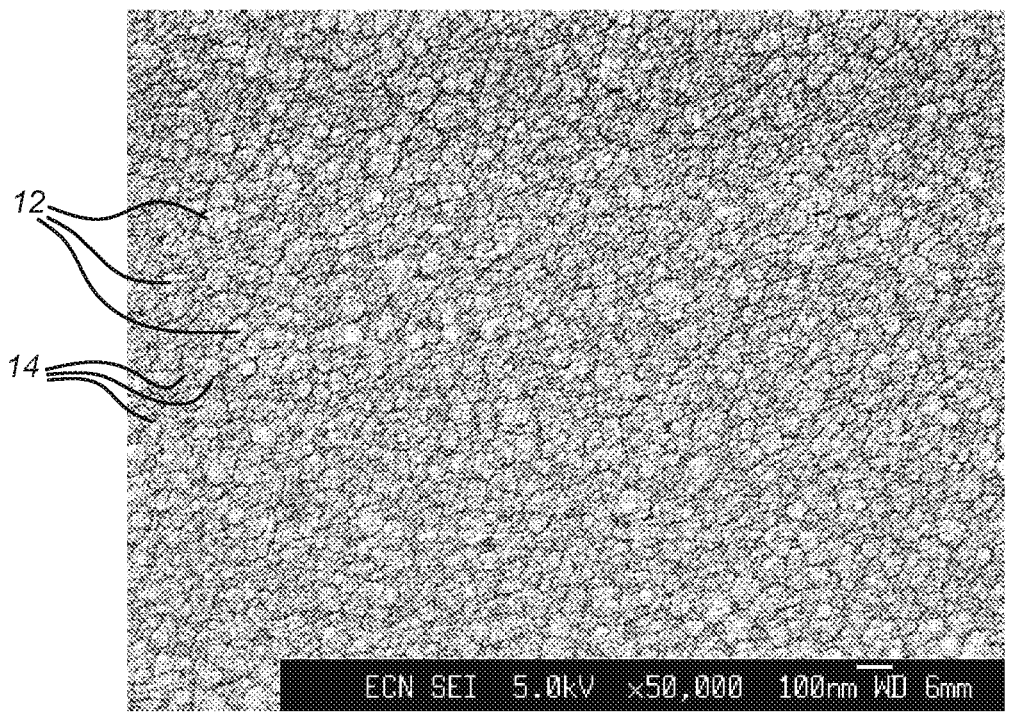

The present invention will be discussed in more detail hereinafter based on a number of exemplary embodiments with reference to the drawings, in which FIG. 1 shows a cross section of an embodiment of a rechargeable battery according to the present invention;

FIG. 2 shows a screen image from an electron microscope depicting a cross section of an embodiment of a nanostructured silicon thin film layer according to the present invention; and FIG. 3 shows a screen image from an electron microscope depicting a top view of an embodiment of a nanostructured silicon thin film layer according to the present invention.

DETAILED DESCRIPTION OF EXEMPLARY EMBODIMENTS

FIG. 1 shows a cross section of an embodiment of a rechargeable battery 1 according to the present invention. In the embodiment shown, the rechargeable battery 1 comprises at least an electrolyte layer 2, a cathode layer 4 and an anode layer 6, wherein said layers 2, 4, 6 are enclosed by a housing 1a. The electrolyte layer 2 comprises a lithium salt compound that is arranged between a cathode surface 8 of the cathode layer 4 and an anode surface 10 of the anode layer 6. The cathode layer 4 as well as the anode layer 6 are each arranged on a respective substrate 5.

In FIG. 2 an exemplary embodiment of an anode layer according to the invention is shown. The anode layer 6 comprises a nanostructured silicon thin film layer comprising a plurality of silicon columns 12 or columns 12 arranged on the substrate 5. The nanostructured silicon thin film layer has a measured crystal fraction of zero or substantially zero, so the nanostructured silicon thin film layer comprises amorphous silicon (a-Si), in particular the plurality of silicon columns 12 or columns 12 comprise amorphous silicon, in which nanocrystalline regions exist.

In light of the present invention the term "amorphous silicon" should be construed as comprising protocrystalline silicon, which is a definition for amorphous silicon comprising a fraction of nano-crystalline silicon. This fraction may be up to about 80% of the nanostructured silicon thin film layer. So for ease of reference the term amorphous silicon will be used hereinafter to indicate that the nanostructured silicon thin film layer comprises amorphous silicon, in which nano-crystalline regions of the nanostructured silicon thin film layer are present with a fraction of nano-crystalline silicon upto about 80%.

Furthermore, it is noted that additionally or alternatively to "silicon", the columns may comprise a silicon-based material, i.e., a silicon based alloy or silicon based mixture. Thus the term "silicon" should also be construed as comprising silicon-based materials, i.e., silicon based alloys or silicon based mixtures.

According to an embodiment, the nanostructured silicon thin film layer comprises n-type or p-type dopants to obtain a nanostructured silicon thin film layer of either n-type conductivity or p-type conductivity, respectively.

According to an embodiment, the silicon alloy is selected from a group of silicon based alloys or silicon based mixtures comprising Si—C, Si—N, Si—Ge, Si—Ag and Si—Sn.

According to the invention, the columns may comprise either amorphous silicon or amorphous silicon alloy or a combination of amorphous silicon and amorphous silicon alloy.

Also, the anode layer may comprise a mixture of an amorphous material and nano-crystalline phase. For example, a mixture of amorphous silicon and nano-crystalline silicon, or a mixture of amorphous silicon with nano-crystalline silicon alloy, or an mixture of silicon and silicon based alloy predominantly in an amorphous state comprising a fraction (upto about 80%) of the mixture in a nano-crystalline state.

According to the present invention, the amorphous silicon columns 12 are extending in a perpendicular direction from the anode surface 10, i.e., the interface between the anode layer and the electrolyte layer, in which the plurality of silicon columns 12 are arranged adjacent to each other while separated by interfaces extending perpendicularly to the anode surface 10.

The rechargeable battery 1 of the present invention exhibits a higher storage capacity per unit weight than prior art lithium ion batteries as the plurality of silicon columns 12 and interfaces 14 there between improve the accessibility and diffusion of lithium ions in and out of the nanostructured silicon thin film layer during a charging cycle, i.e. during lithium (de)intercalation. As a result, specific storage capacity of up to 4000 mAh/g is achievable with the rechargeable battery 1 of the present invention.

In an embodiment, the interfaces 14 resemble grain-like column boundaries 14 between the columns that extend in the perpendicular direction. According to the invention, the term "grain-like column boundaries" refers to a type of interface or region between adjoining silicon columns 12 (domains) that resemble grain or crystal boundaries as customarily defined for grains consisting of crystalline atomic lattices. So, although the plurality of silicon columns 12 comprise amorphous silicon-based material, the silicon columns 12 exhibit a grain-like engagement between adjoining columns.

It is the interface boundary 14 between adjoining silicon columns 12 that provides the rechargeable battery 1 of the present invention with improved storage capacity per unit weight as well as improved lithium diffusion between the silicon columns 12 due to sufficient porosity of the interfaces in the nanostructured silicon thin film layer.

In some embodiments the nanostructured silicon thin film layer comprises at least in part free space between the plurality of silicon columns 12 in addition to the columnar interfaces engagement there between, in which the free space further facilitates volumetric changes during charging and discharging cycles of the rechargeable battery 1, hence reducing capacity fading.

In a further embodiment, the silicon columns 12 also comprise dendritic or multibranch silicon columns 12, thus having the silicon columns 12 comprising tree-like branches of amorphous silicon.

In these embodiments the above mentioned grain-like or crystal-like engagement between adjoining silicon columns 12 remains present at particular contact regions, points or lines between said columns 12.

To further explain the complex and novel structure of the nanostructured silicon thin layer of the present invention, FIG. 3 shows a top view of an embodiment of the nanostructured silicon thin film layer. In the embodiment shown, the plurality of silicon columns 12 are depicted as brighter areas or granular spots and form a grain-like or "poly crystalline" pattern. The column boundaries 14 between the plurality of silicon columns 12 are depicted as darker areas separating the granular spots. From FIG. 3 it is further seen that the grain or granular pattern resembles a poly-crystalline structure even though the plurality of silicon columns 12 are proto-crystalline i.e., comprise amorphous silicon and nano-crystalline silicon. This complex and unique granular pattern between the plurality of silicon columns 12 provides the nanostructured silicon thin film layer with its improved storage capacity per unit weight as well as improved lithium diffusion through the nanostructured silicon thin film layer.

Another advantage of the rechargeable battery 1 is that the plurality of silicon columns 12 and interfaces 14 therebetween allow for volumetric changes of the nanostructured silicon thin film layer when lithium ions are absorbed and released. More precisely, the interfaces 14 or spaces between the plurality silicon columns 12 enable stress relaxation during volumetric changes thereof during lithium ion (de) intercalation, so that cracking and pulverization of the nanostructured silicon thin film layer is reduced. Charge retention of up to 85% after 100 recharging cycles of the rechargeable battery 1 is feasible.

In an embodiment, the nanostructured silicon thin film layer (i.e. the anode layer 6) has a porosity of about 30% to about 60%, which is defined by a spatial distribution and arrangement of the plurality of silicon columns 12 across the anode layer 6. The porosity of the nanostructured silicon thin film layer provides improved diffusion of lithium ions throughout the silicon anode layer 6 and to facilitate volumetric changes and stress relaxation of the silicon anode layer 6 during the (de)intercalation process. The porosity value has been deduced from optical measurements for samples of nanostructured silicon thin films, in accordance with a method described by Braun in Thin Solid Films, vol. 496 (2004) p 505.

In most embodiments the spatial distribution or arrangement of the plurality of silicon columns 12 is a substantially random distribution across the anode layer 6. That is, the plurality of silicon columns 12 is randomly distributed in lateral sense with respect to the planar direction, e.g. parallel to the anode surface 10. This random distribution of silicon columns 12 and interfaces 14 there between does not only provide improved lithium diffusion and stress relieve within the nanostructured silicon thin film layer during volumetric changes thereof, but the random distribution of the plurality of silicon columns 12 and interfaces 14 also facilitates the manufacturing process as the spatial distribution need not be actively controlled. In essence the nanostructured silicon thin film layer is a self-organized nanostructured silicon thin film layer.

In an embodiment, the interfaces 14 form diffusion paths for lithium ions during intercalation and de-intercalation. The diffusion paths provided by the interfaces 14 improve accessibility for lithium ions to each of the plurality of silicon columns 12 and to be absorbed and released by it during (de)intercalation. Consequently, energy storage capacities of up to 4000 mAh/g are achievable. The interfaces 14 also reduce stress and strain within the plurality of silicon columns 12 by allowing for volumetric changes thereof upon lithium ion insertion and extraction, thereby minimizing cracking and pulverization of the nanostructured silicon thin film layer.

In advantageous embodiments each one of the plurality of silicon columns 12 is elongated in the perpendicular direction perpendicular to the anode surface that interfaces with the electrolyte layer. In this embodiment the plurality of silicon columns 12 can be envisaged as nanostructured elongated columns 12 or posts 12 arranged perpendicular or substantially perpendicular to the anode surface 10 and/or the substrate 5 of the anode layer 6. The elongated shape of the plurality of silicon columns 12 increases the freedom for volumetric changes of each of the silicon columns 12 during (de)intercalation of lithium ions. For example, each of the silicon columns 12 has more freedom to expand or contract laterally with respect to the perpendicular direction, so that cracking and pulverization of the plurality of silicon columns 12 is reduced and hence capacity fading is kept to a minimum.

In an embodiment, the plurality of silicon columns 12 have a length (or height) in the perpendicular direction of about 0.1 µm to about 10 µm, thereby providing a sufficiently thin silicon anode layer 6 that has an improved resistance to cracking and pulverization over multiple recharging cycles.

In an embodiment, the length of the silicon columns is between about 3 µm to about 8 µm.

In a further specific embodiment, each one of the plurality of silicon columns 12 has an average footprint of about 0.25 µm$^2$ to about 0.5 µm$^2$ along the anode surface of the nanostructured silicon thin film layer, which provides an improved aspect ratio between a base width and length/height in the perpendicular direction of each of the silicon columns 12, which further facilitates volumetric changes during lithium (de)intercalation hence reduced cracking and pulverization of each of the silicon columns 12.

In an advantageous embodiment, the nanostructured silicon thin film layer is arranged on a substrate comprising a metallic conductor layer, e.g. copper, nickel, which provide excellent electrical conductivity.

In the light of the present invention, various lithium salt compounds can be used in conjunction with the nanostructured silicon thin film layer. For example, in a group of embodiments the lithium salt compound may comprise $LiCoO_2$ ("Li-cobalt"), $LiMn_2O_4$ ("Li-manganese spinel", "LMO"), $LiFePO_4$ ("Li-phosphate"), $LiNiMnCoO_2$ ("NMC"), $LiNiCoAlO_2$ ("NCA") or $Li4Ti_5O_{12}$ ("Li-titanate", "LTO"). Each of these lithium salt compounds can be found in particular applications, ranging from electric vehicle (EV) batteries to portable computer batteries, cell phone batteries and the like. The rechargeable battery 1 of the present invention can therefore be used in existing battery configurations of commercial products.

In a further aspect, the present invention relates to a method of manufacturing a rechargeable battery. Reference is made to the FIGS. 1, 2 and 3.

According to the invention, a method is provided for manufacturing a rechargeable battery 1 comprising at least an electrolyte layer 2, a cathode layer 4 and an anode layer 6. The method comprises the steps of forming on a substrate 5 a nanostructured silicon thin film layer as an anode layer 6, wherein the forming process is configured to create the nanostructured silicon thin film layer comprising a plurality of adjacent silicon columns 12 (i.e., silicon based columns). As explained above, a nanostructured silicon thin film layer is capable of providing a significantly higher, e.g. 10 fold, energy storage capacity than prior art graphite anodes.

During the formation process, the silicon-based columns 12 are extending perpendicular to a surface of the nanostructured thin film layer. The plurality of silicon columns 12 is arranged adjacent to each other while separated by interfaces 14 extending in the perpendicular direction, with the separation distance of the interfaces being substantially parallel to the surface of the nanostructured thin film layer.

Once formed, the plurality of silicon columns 12 comprise amorphous silicon (am-Si), as verified by structural analysis of the thin film material.

As mentioned hereinbefore, the term amorphous silicon should be construed as comprising proto-crystalline silicon, thus wherein amorphous silicon comprises regions of nano-crystalline silicon in a fraction up to about 80% of the nanostructured silicon thin film layer. Further, the term "silicon" should also be construed as comprising silicon-based materials, i.e., silicon alloys.

The method further comprises providing a lithium salt compound as the electrolyte layer 2 and arranging the electrolyte layer 2 between a cathode surface 8 of the cathode layer 4 and an anode surface 10 of the anode layer 6.

An advantage of the method is that the plurality of silicon columns 12 are formed in a self organising fashion and randomly distributed across the substrate 5, so it is not necessary to actively steer or control the column formation. The method of the present invention is therefore a one-step, self organising, spontaneous process for forming a nanostructured silicon thin film layer without pre- or post-method steps. As a result the method is readily adapted to produce silicon based anodes at industrial levels for commercialization.

Another advantage of the method is that a variety of substrates 5 can be used for forming the nanostructured silicon thin film layer. The substrate 5 may comprise either a metallic layer or a semiconductor layer. In most embodiments, however, the substrate 5 will be a metallic substrate or metallic substrate layer (e.g. copper, nickel) in view of good electrical conductivity thereof.

In an embodiment, the forming process comprises deposition of the anode layer 6 by Plasma Enhanced Chemical Vapour Deposition (PECVD), thereby allowing for deposition of a nanostructured thin film anode layer having a thickness of 0.05 μm to 10 μm.

In a further embodiment, the PECVD process comprises the use of a microwave plasma of a mixture of a silicon compound gas and hydrogen, $H_2$. The silicon compound may be for example silane $SiH_4$ or a chloro-silane e.g. $SiCl_4$ or $SiH_2Cl_2$.

The use of microwave frequencies reduces ion bombardment of anode growth zones on the substrate during the forming process, so that growth rates of the anode layer 6 are increased.

In an even further embodiment, the mixture of silicon compound gas and $H_2$ further comprises argon (Ar). Using such a mixture allows for a sustained plasma at lower pressures and to promote self organized growth of the nanostructured silicon thin film layer, i.e. the plurality of silicon columns 12 and column boundaries, i.e., interfaces 14 there between. Here, self organized growth means that the formation of the plurality of silicon columns 12 and interfaces 14 there between occurs spontaneously. The plurality of silicon columns 12 are deposited in a substantially random fashion across and along the substrate 5, thus forming a substantially random arrangement. The self organized formation of the plurality of silicon columns 12 can be viewed as a one step manufacturing process, circumventing pre- and post-treatment of the substrate 5 or deposited silicon anode layer 6.

Additionally, the formation of the nanostructured thin film layer comprises addition of a doping pre-cursor to obtain a doped nanostructured silicon thin film layer of either n-type or p-type in dependence of the precursor type. In an embodiment, the precursor is a gaseous species added to the mixture of silane and hydrogen.

In many embodiments the PECVD process is a low-pressure PECVD process. For example, in an embodiment the low-pressure PECVD process comprises pressures above 0.15 mbar, so that a sustainable plasma can be maintained when a mixture of the silicon compound gas e.g. silane, $SiH_4$, and hydrogen, $H_2$, is used. In another embodiment the low-pressure PECVD process comprises pressures below 0.15 mbar when the mixture of e.g., silane, $SiH_4$, and hydrogen, $H_2$, further comprises argon (Ar).

In a further embodiment, the PECVD process is a microwave PECVD process. To allow for large area production of silicon anode layers 6, in an advantageous embodiment the microwave plasma is created by an elongated antenna wire, of which each end of the wire is coupled to a microwave generator. The elongated antenna wire provides a substantially linear and uniform field of microwave radiation in the plasma reactor during the formation process, so that a more uniform deposition of the plurality of silicon columns is achieved over a large area. In an embodiment the length of the antenna wire is 50 cm or more, e.g. 60 cm. The length of the antenna wire directly influences the surface produced of the nanostructure silicon thin film layer. Increasing the length of the antenna wire typically increases the achievable surface area of the nanostructured silicon thin film layer that can be manufactured.

Without any limitation of the inventive concept and without being bound to any theory on the deposition mechanism, it is considered that according to an embodiment the method for formation of the nanostructured silicon thin film, is configured to provide growth conditions of the silicon thin film where the deposited silicon atoms experience a relatively low surface mobility resulting in the typical columnar structure of the nanostructured silicon thin film.

The present invention embodiments have been described above with reference to a number of exemplary embodiments as shown in and described with reference to the drawings. Modifications and alternative implementations of some parts or elements are possible, and are included in the scope of protection as defined in the appended claims.

The invention claimed is:

1. A method for manufacturing a rechargeable battery including at least an electrolyte layer, a cathode layer, and an anode layer, the method comprising:

forming directly on either an exposed metallic substrate surface or an exposed metallic substrate layer surface, a nanostructured silicon thin film layer as the anode layer, by deposition of the anode layer on the exposed metallic substrate surface or the exposed metallic substrate layer surface by a low pressure plasma enhanced chemical vapor deposition (PECVD) process using a microwave plasma of a mixture comprising a silicon containing gas and hydrogen ($H_2$), the forming process being a self-organizing process configured to create the nanostructured silicon thin film layer as a continuous nanostructured silicon thin film layer consisting of a plurality of columns comprising dendritic or multi-branch columns, the plurality of columns extending in a perpendicular direction from the substrate and arranged adjacent to each other while separated by column boundaries extending in the perpendicular direction, the plurality of columns comprising amorphous silicon-based material consisting of either amorphous silicon or an amorphous silicon-based alloy or an amorphous silicon-based mixture in which amorphous silicon-based material comprises protocrystalline silicon consisting of amorphous silicon comprising a fraction of nanocrystalline silicon, the fraction of nanocrystalline silicon being up to about 80% of the nanostructured silicon thin film layer;

providing a lithium salt compound as the electrolyte layer; and arranging the electrolyte layer between a cathode surface of the cathode layer and an anode surface of the nanostructured thin film, wherein the plurality of columns have a length in the perpendicular direction from the substrate of about 0.1 micrometers to about 10 micrometers, and each one of the columns has an average footprint configured to reduce cracking and pulverization of the nanostructured silicon thin film layer of about 0.25 micrometers squared to about 0.5 micrometers squared.

2. The method according to claim 1, wherein the microwave plasma is created by an elongated antenna wire, each end of the elongated antenna wire being coupled to a microwave generator.

3. The method according to claim 1, wherein the mixture of the silicon containing gas and $H_2$ further comprises an alloying component, to form the silicon alloy.

4. The method according to claim 1, wherein the forming of the nanostructured silicon thin film layer comprises adding a doping precursor of either n-type or p-type for doping the nanostructured silicon thin film layer either as an n-type conductive layer or a p-type conductive layer.

5. The method according to claim 3, wherein the mixture of the silicon containing gas and $H_2$ further comprises argon.

6. The method according to claim 1, wherein the substrate comprises a metallic conductor layer or a semiconductor layer.

7. The method according to claim 1, wherein the silicon containing gas is selected from a group comprising silane and chlorosilanes.

* * * * *